(12) United States Patent
Takagi et al.

(10) Patent No.: US 7,993,806 B2
(45) Date of Patent: Aug. 9, 2011

(54) TRANSFER SUBSTRATE, AND FABRICATION PROCESS OF ORGANIC ELECTROLUMINESCENT DEVICES

(75) Inventors: Ryoko Takagi, Tokyo (JP); Shigeyuki Matsunami, Kanagawa (JP); Yasunori Kijima, Tokyo (JP)

(73) Assignee: Sony Corporation, Tokyo (JP)

( * ) Notice: Subject to any disclaimer, the term of this patent is extended or adjusted under 35 U.S.C. 154(b) by 578 days.

(21) Appl. No.: 12/059,667

(22) Filed: Mar. 31, 2008

(65) Prior Publication Data

US 2008/0241768 A1    Oct. 2, 2008

(30) Foreign Application Priority Data

Apr. 2, 2007  (JP) ................................. 2007-096271

(51) Int. Cl.
*G03F 7/00* (2006.01)
*B41M 5/025* (2006.01)

(52) U.S. Cl. ..................... 430/200; 430/199; 430/270.1; 503/227

(58) Field of Classification Search ............... 430/270.1, 430/7, 200, 273.1, 271.1; 503/227
See application file for complete search history.

(56) References Cited

U.S. PATENT DOCUMENTS

| | | | | |
|---|---|---|---|---|
| 6,114,088 A * | 9/2000 | Wolk et al. | ............. | 430/273.1 |
| 6,140,009 A * | 10/2000 | Wolk et al. | ............. | 430/200 |
| 6,194,119 B1 * | 2/2001 | Wolk et al. | ............. | 430/200 |
| 7,166,010 B2 * | 1/2007 | Lamansky et al. | ............. | 445/24 |
| 7,192,657 B2 * | 3/2007 | Roberts et al. | ............. | 428/690 |
| 7,399,993 B2 * | 7/2008 | Matsuda | ............. | 257/89 |
| 7,776,456 B2 * | 8/2010 | D'Andrade et al. | ............. | 428/690 |
| 2006/0204784 A1 * | 9/2006 | Begley et al. | ............. | 428/690 |
| 2007/0046189 A1 * | 3/2007 | Hatwar et al. | ............. | 313/506 |
| 2007/0126347 A1 * | 6/2007 | Jarikov et al. | ............. | 313/506 |

FOREIGN PATENT DOCUMENTS

| | | |
|---|---|---|
| JP | 11-260549 | 9/1999 |
| JP | 2002-110350 | 4/2002 |
| JP | 2003-229259 | 8/2003 |
| JP | 2003-257641 A | 9/2003 |
| JP | 2006-331677 A | 7/2006 |
| JP | 2006-309955 A | 9/2006 |

OTHER PUBLICATIONS

Japanese Patent Office, Office Action issued in Patent Application JP 2007-096271, on Aug. 11, 2009.

* cited by examiner

*Primary Examiner* — Amanda C. Walke
(74) *Attorney, Agent, or Firm* — SNR Denton US LLP

(57) ABSTRACT

A transfer substrate is provided with a photothermal conversion layer and a transfer layer formed in this order on a base substrate. The transfer layer is formed of an organic material selected from the group including a first organic material, which has a weight decrease initiation temperature ($T_{sub}$) of lower than 500° C. and sublimates under atmospheric pressure, and a second organic material, which has a weight decrease initiation temperature ($T_{sub}$) of lower than 500° C. and satisfies the following inequality: $T_{sub}-T_m<200°$ C. ($T_{sub}$: the weight decrease initiation temperature of the second organic material, and $T_m$: a melting point of the second organic material). Also disclosed is a process for fabricating organic electroluminescent devices by using the transfer substrate.

8 Claims, 5 Drawing Sheets

TRANSFER SUBSTRATE, AND FABRICATION PROCESS OF ORGANIC ELECTROLUMINESCENT DEVICES

CROSS REFERENCES TO RELATED APPLICATIONS

The present invention contains subject matter related to Japanese Patent Application JP 2007-096271 filed in the Japan Patent Office on Apr. 2, 2007, the entire contents of which being incorporated herein by reference.

BACKGROUND OF THE INVENTION

1. Field of the Invention

This invention relates to a transfer substrate and a fabrication process of organic electroluminescent devices, and especially to a transfer substrate useful in the transfer of a hole-transporting material and a process for fabricating organic electroluminescent devices by using the transfer substrate.

2. Description of the Related Art

Organic electroluminescent devices making use of electroluminescence of organic materials are each formed by arranging an organic layer, which is composed of a hole transport layer and a light emitting layer stacked together, between a lower electrode and an upper electrode, and are attracting interests as light emitting devices enabling high-brightness light emission by a low-voltage DC drive.

A full-color display system making use of such organic electroluminescent devices include organic electroluminescent devices of respective red (R), green (G) and blue (B) colors formed in arrays on a substrate. In the manufacture of such a display system, light emitting layers which are formed of organic light emitting materials capable of emitting lights of the respective colors need to be formed in patterns corresponding to the respective electroluminescence devices. The formation of each light emitting layer in the corresponding pattern is performed, for example, by the shadow masking process that the light emitting material is vapor-deposited or coated through a mask formed by providing a pattern of apertures in a sheet, or by the inkjet process.

However, the formation of a pattern by the shadow masking process has difficulty in achieving further microfabrication and higher integration for organic electroluminescent devices, because further microfabrication is hardly feasible as to an aperture pattern to be formed in a mask, and due to flexing and stretching of the mask, difficulties are encountered in forming such patterned apertures at the regions of electroluminescent devices with high positional accuracy. In addition, a functional layer formed beforehand primarily of an organic layer is prone to damage by its contact with the mask in which the aperture pattern is formed, thereby causing a reduction in fabrication yield.

On the other hand, the formation of a pattern by the inkjet process can hardly realize further microfabrication and higher integration for electroluminescent devices and an enlargement for a substrate.

As a new pattern-forming process for light emitting layers made of organic materials and other organic layers, a transfer process making use of an energy source (heat source), that is, the heat transfer process has been proposed accordingly. Manufacture of a display system, which makes use of the heat transfer process, is performed, for example, as will be described next. Firstly, a lower electrode is formed beforehand on a substrate for the display system (hereinafter called "the system substrate"). On the other hand, a light emitting layer is formed beforehand on another substrate (hereinafter called "the transfer substrate") via a photothermal conversion layer. With the light emitting layer and the lower electrode being positioned opposite each other, the system substrate and the transfer substrate are arranged. A laser beam is irradiated from the side of the transfer substrate so that the light emitting layer is thermally transferred onto the lower electrode on the system substrate. By causing the spot-irradiated laser beam to scan at this time, the light emitting layer is thermally transferred onto the lower electrode at predetermined regions with good positional accuracy (see Japanese Patent Laid-Open Nos. 2002-110350 and Hei 11-260549).

A method is also disclosed to provide organic electroluminescent devices with improved luminescence efficiency and brightness half-life upon their production by the heat transfer process. According to this method, a display substrate and a donor element are subjected to heat treatment before thermally transferring a light emitting layer (see Japanese Patent Laid-Open No. 2003-229259).

SUMMARY OF THE INVENTION

In the above-mentioned heat transfer process, however, the light emitting layer, depending on the organic material employed there, is liquefied by the irradiation with a laser beam and is hardly transferred. In particular, a hole-transporting organic material useful in an organic electroluminescent device remains as a part of a transfer layer in a liquefied state on a surface of a transfer substrate because a hole transport layer is generally formed thick. Reference is now had to FIG. 6A, which is a micrograph of a surface of a transfer substrate after thermal transfer was performed using a transfer substrate carrying thereon a transfer layer formed of "HT539" (trade name, product of Idemitsu Kosan Co., Ltd.) as a hole-transporting organic material. A plurality of liquid droplets such as that shown in a closeup photo of FIG. 6B were confirmed to remain. As illustrated in FIG. 6C which is a graph obtained by measuring the surface height of an X-X' cut section of FIG. 6A, it has also been confirmed that the liquid droplets remain in a pattern of asperities on the transfer substrate. The heat transfer process, therefore, involves problems of a reduced luminescence efficiency, an increased drive voltage, a reduced brightness half-life and the like due to the failure in surely forming a hole transport layer in a pattern.

It is desirable to provide a transfer substrate capable of surely forming an organic material layer in a pattern on a transferred substrate by the heat transfer process and also a process for fabricating organic electroluminescent devices by using the transfer substrate.

In a first transfer substrate according to an embodiment of the present invention with a photothermal conversion layer and a transfer layer formed in this order on a base substrate, the transfer layer is formed of an organic material selected from the group including a first organic material, which has a weight decrease initiation temperature ($T_{sub}$) of lower than 500° C. and sublimates under atmospheric pressure, and a second organic material, which has a weight decrease initiation temperature ($T_{sub}$) of lower than 500° C. and satisfies the following equation (1):

$$T_{sub} - T_m < 200° \text{ C.} \qquad (1)$$

where $T_{sub}$: the weight decrease initiation temperature of the second organic material, and $T_m$: a melting point of the second organic material.

According to the first transfer substrate as described above, the transfer layer vaporizes at lower than 500° C. without showing any liquid state to assure the transfer of an organic material onto the transferred substrate, when as the organic material, an organic material which has a weight decrease initiation temperature ($T_{sub}$) of lower than 500° C. and sublimates under atmospheric pressure is used. When an organic material the weight decrease initiation temperature ($T_{sub}$) of which is lower than 500° C. and the weight decrease initiation temperature ($T_{sub}$) and melting point ($T_m$) of which satisfy the above-described equation (1) is used, on the other hand, it has been confirmed that as will be described in the detailed description of the invention, the transfer of the organic material onto the transferred substrate can be surely performed insofar as a temperature range in which a liquid state is shown is lower than 200° C.

The present invention also provides a first process for fabricating organic electroluminescent devices by using the first transfer substrate. In a process for fabricating organic electroluminescent devices by forming a lower electrode in a pattern on a device substrate, forming on the lower electrode an organic layer including at least a light emitting layer, and then forming an upper electrode such that the upper electrode is stacked over the lower electrode via the organic layer, the process includes the steps of: arranging the first transfer substrate of the above-described construction such that the transfer layer is directed toward the device substrate with the lower electrode formed thereon, and irradiating light from a side of the base substrate to convert the light into heat in the photothermal conversion layer such that the transfer layer is thermally transferred onto the lower electrode to form at least the light emitting layer of the organic layer.

According to the first fabrication process of organic electroluminescent devices as described above, the use of the first transfer substrate of the above-described construction makes it possible to surely form at least the light emitting layer of the organic layer in a pattern on the lower electrode by the heat transfer process.

In a second transfer substrate according to another embodiment of the present invention with a photothermal conversion layer and a transfer layer formed in this order on a base substrate, the transfer layer is formed of at least three organic material layers stacked one over another, and two of the at least three organic material layers located at the outer sides of said transfer layer are each formed of an organic material selected from the group including a first organic material, which has a weight decrease initiation temperature ($T_{sub}$) of lower than 500° C. and sublimates under atmospheric pressure, and a second organic material, which has a weight decrease initiation temperature ($T_{sub}$) of lower than 500° C. and satisfies the following equation (1):

$$T_{sub}-T_m<200° C. \tag{1}$$

where
$T_{sub}$: the weight decrease initiation temperature of the second organic material, and
$T_m$: a melting point of the second organic material.

According to the second transfer substrate as described above, organic materials such as that described above are used in the respective organic material layers on the sides of the base substrate and surface in the transfer layer formed of the at least three organic material layers stacked one over another. As will be described in the detailed description of the invention, it has been confirmed that the transfer of the transfer layer onto the transferred substrate can be surely performed even when as at least one organic material layer held between the organic material layer on the side of the base substrate and the organic material layer on the side of the surface, an organic material of hardly transferable properties is used.

The present invention also provides a second process for fabricating organic electroluminescent devices by using the second transfer substrate. In a process for fabricating organic electroluminescent devices by forming a lower electrode in a pattern on a device substrate, forming on the lower electrode an organic layer including at least a light emitting layer, and then forming an upper electrode such that the upper electrode is stacked over the lower electrode via the organic layer, the process includes the steps of: arranging the second transfer substrate of the above-described construction such that the transfer layer is directed toward the device substrate with the lower electrode formed thereon, and irradiating light from a side of the base substrate to convert the light into heat in the photothermal conversion layer such that the transfer layer is thermally transferred onto the lower electrode to form at least the light emitting layer of the organic layer.

According to the second fabrication process of organic electroluminescent devices as described above, the use of the second transfer substrate of the above-described construction makes it possible to surely transfer at least the light transmitting layer of the organic layer onto the lower electrode by the heat transfer process.

As has been described above, each transfer substrate according to the embodiments of the present invention and each fabrication process according to the embodiments of the present invention, the fabrication process making use of the transfer substrate, make it possible to surely transfer at least the light emitting layer of the organic layer onto the lower electrode by the heat transfer process, and therefore, can avoid deteriorations in the characteristics of organic electroluminescent devices which would otherwise occur due to incomplete transfer of the organic layer.

DETAILED DESCRIPTION OF PREFERRED EMBODIMENTS

Now the preferred embodiments of the present invention are described in detail with reference to the accompanying drawings. In the following description, a transfer substrate useful for the formation of a hole transport layer of a full-color display system includes organic electroluminescent devices of respective red (R), green (G) and blue (B) colors formed in arrays on the substrate and a process for fabricating a display system including a transfer process making use of the transfer substrate are described.

First Embodiment

<Transfer Substrate>

Figure 1:
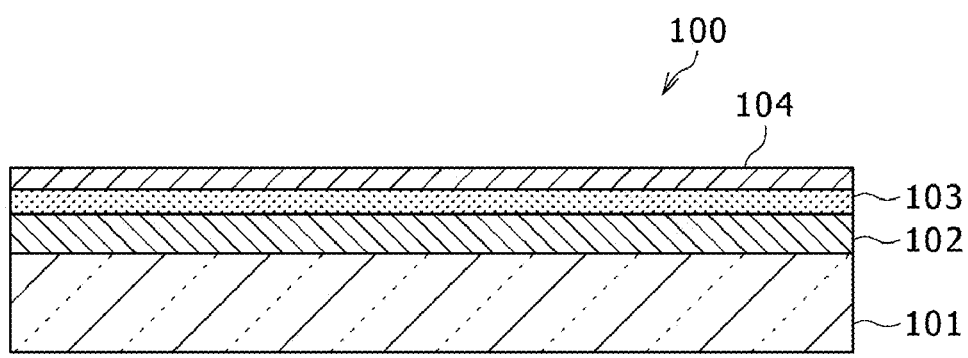
FIG. 1 is a cross-sectional view for describing a first embodiment of the transfer substrate of the present invention.

Referring first to FIG. 1, a description will hereinafter be made of the construction of a transfer substrate 100 according to the first embodiment of the present invention. The transfer substrate 100 depicted in the figure is useful, for example, for the formation of a hole transport layer in an organic electroluminescence device, and is composed of a photothermal conversion layer 102, an antioxidation layer 103 and a transfer layer 104 formed in this order on a base substrate 101.

Of these, the base substrate 101 is made of a material which transmits light hr of a predetermined wavelength to be irradiated in a transfer to be performed using the transfer substrate 100. When a laser beam of approx. 800 nm wavelength from a solid-state laser source is employed as this light hr, for example, a glass substrate may be used as the base substrate 101.

The photothermal conversion layer 102 is formed using a material, which has a high photothermal conversion efficiency in converting the light hr into heat and has a high melting point. When the above-mentioned laser beam of approx. 800 nm wavelength is employed as the light hr, for example, a metal of low reflectivity and high melting point, such as chromium (Cr) or molybdenum (Mo), can be used preferably in the photothermal conversion layer 102. Further, this photothermal conversion layer 102 is supposed to be adjusted to such a thickness as enabling to obtain a necessary and sufficient photothermal conversion efficiency. When a Mo film is formed as the photothermal conversion layer 102, for example, the photothermal conversion layer 102 is supposed to be used at a thickness of 200 nm or so. This photothermal conversion layer 102 can be formed, for example, by a sputter film-forming process. It is to be noted that the photothermal conversion layer 102 is not limited to the above-mentioned metal material but may be in the form of a film containing a pigment as a light-observing material or a film made of carbon.

On the photothermal conversion layer 102, the antioxidant layer 103 is arranged to prevent oxidation of the material that makes up the photothermal conversion layer 102. The antioxidant layer 103 as described above is formed with silicon nitride ($SiN_x$), silicon oxide ($SiO_2$) or the like, for example, by the CVD (Chemical Vapor Deposition) process. It is to be noted that this antioxidant layer 103 may be omitted when the photothermal conversion layer 102 is formed of an oxidation-resistant material.

Further, the transfer layer 104 is arranged on the antioxidant layer 103. As features characteristic to the present invention, this transfer layer 104 is formed of an organic material selected from the group including a first organic material, which has a weight decrease initiation temperature ($T_{sub}$) of lower than 500° C. and sublimates under atmospheric pressure, and a second organic material, which has a weight decrease initiation temperature ($T_{sub}$) of lower than 500° C. and satisfies the following equation (1):

$$T_{sub} - T_m < 200° C. \quad (1)$$

where $T_{sub}$: the weight decrease initiation temperature of the second organic material, and $T_m$: a melting point of the second organic material.

The weight decrease initiation temperature ($T_{sub}$) indicates a temperature at the time point that the weight of the organic material has decreased by 5% when measured as measured under atmospheric pressure, and therefore, serves as an index of a temperature at which the organic material vaporizes. The melting point ($T_m$), on the other hand, indicates a value measured by a differential scanning calorimeter (DSC) under atmospheric pressure.

When an organic material, which has a weight decrease initiation temperature ($T_{sub}$) of lower than 500° C. and sublimates under atmospheric pressure, is used as the transfer layer 104, the transfer layer 104 vaporizes at lower than 500° C. without showing any liquid state so that the transfer of the organic material onto the transferred substrate can be surely effected. As such an organic material, "LG101C" (trade name, product of LG Chem, Ltd.) can be mentioned, for example.

Figure 2:
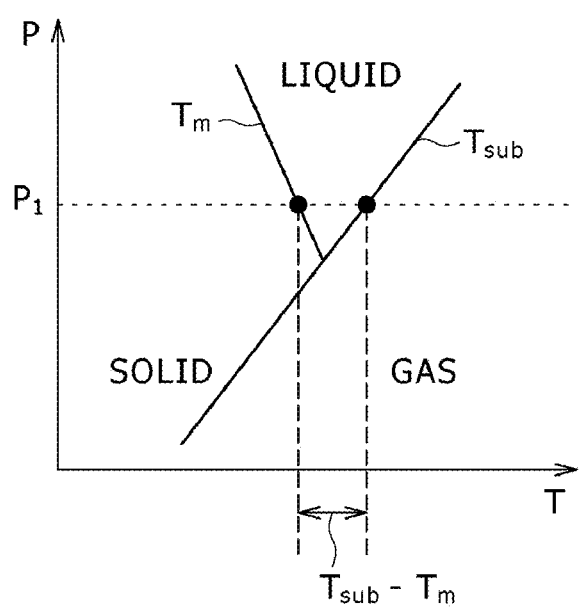
FIG. 2 is a conceptual diagram which illustrates the states (solid, liquid, and gas) of a certain material when the temperature (T) and pressure (P) were varied.

When an organic material, the weight decrease initiation temperature ($T_{sub}$) of which is lower than 500° C. and the weight decrease initiation temperature ($T_{sub}$) and melting point ($T_m$) of which satisfy the above-described equation (1), is used as the transfer layer 104, on the other hand, it has been confirmed that as shown in the conceptual diagram of FIG. 2, $T_{sub} - T_m$ falls within a temperature range indicative of a liquid state under atmospheric pressure ($P_1$) and that the transfer of the organic material onto the transferred substrate can be surely effected when the above-mentioned temperature range is lower than 200° C.

It is to be noted that upon formation of a hole transport layer for each organic electroluminescent device, the hole transport layer is formed at a thickness of 50 nm or greater in many instances and that the use of an organic material specified as described above is important because in the heat transfer process, the transfer becomes more difficult as the thickness increases. It should now be assumed that this embodiment uses a transfer substrate 100 with a transfer layer 104 formed of α-NPD (N,N'-bis(1-naphthyl)-N,N'-diphenyl[1,1'-biphenyl]-4,4'-diamine) represented by the following structural formula (1), which is a hole-transporting material, as a material satisfying the above-described equation (1).

Structural formula (1)

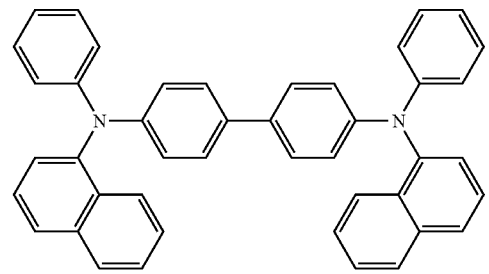

A description will, therefore, be made about the embodiment in which the transfer layer 104 is formed of α-NPD. It is, however, to be noted that, as organic materials the weight decrease initiation temperature ($T_{sub}$) of which is lower than 500° C. and the weight decrease initiation temperature ($T_{sub}$) and melting point ($T_m$) of which satisfy the above-described equation (1), $Alq_3$ [tris(8-hydroxyquinoline)aluminum], ADN [9,10-di(2-naphthyl)anthracene] and CBP [4,4'-bis(9-dicarbazolyl)-2,2'-biphenyl] can be mentioned in addition to α-NPD described above.

<Fabrication Process of Organic Electroluminescent Devices>

Figure 3A:
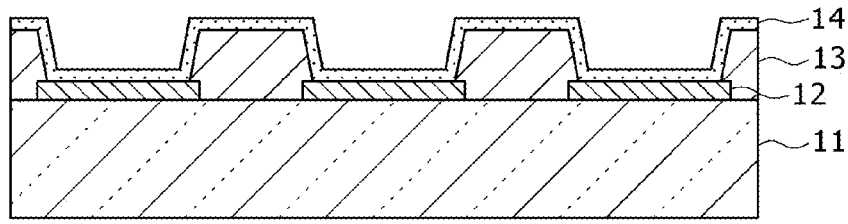
FIGS. 3A through 3E are cross-sectional views of organic electroluminescent devices in various steps of a first embodiment of the process of the present invention for the fabrication of the organic electroluminescent devices.

A description will next be made about a fabrication process of organic electroluminescent devices, which makes use of the above-described transfer substrate 100. As illustrated in FIG. 3A, a system substrate 11 on which organic electroluminescent devices are to be formed in arrays is firstly provided. This system substrate 11 is made of a glass, silicon or plastic substrate, a TFT substrate with TFTs (thin film transistors) formed thereon, or the like. It should now be assumed that this system substrate 11 is made of a material having light transparency especially when the display system to be manufactured in this embodiment is of the transmission type that emitted light is outputted from the side of the system substrate 11.

On the system substrate 11, a lower electrode 12 to be employed as an anode or cathode is next formed in patterns.

It should be assumed that this lower electrode 12 is patterned in a configuration suited for the drive system of the display system to be fabricated in this embodiment. When the drive system of the display system is a simple matrix system, for example, the lower electrode 12 is formed, for example, in stripes. When the drive system of the display system is an active matrix system that TFTs are arranged for respective pixels, on the other hand, the lower electrode 12 is formed in patterns corresponding to the respective pixels arranged in plural arrays such that the lower electrode 12 is connected to the TFTs, which arranged likewise in association with the respective pixels, via contact holes (not shown) formed through an interlayer insulation film which covers these TFTs.

It should also be assumed that for the lower electrode 12, a suitable material is chosen and used depending upon the light output system of the display system to be manufactured in this embodiment. Described specifically, the lower electrode 12 is formed with a highly reflective material when the display system is of the top emitting type that emitted light is outputted from a side opposite to the system substrate 11. On the other hand, the lower electrode is formed with a light transmitting material when the display system is of the transmission type that emitted light is outputted from the side of the system substrate 11 or is of the dual-sided emission type.

For example, it is now assumed that the display system is of the top emitting type and the lower electrode 12 is used as an anode. In this case, the lower electrode 12 is formed with a high-reflectivity conductive material, such as silver (Ag), aluminum (Al), chromium (Cr), iron (Fe), cobalt (Co), nickel (Ni), copper (Cu), tantalum (Ta), tungsten (W), platinum (Pt) or gold (Au), or an alloy thereof.

When the display system is of the top emitting type but the lower electrode 12 is used as a cathode, the lower electrode 12 is formed using a conductive material having a small work function. As an example of such a conducive material, an alloy of an active metal such as lithium (Li), magnesium (Mg) or calcium (Ca) and a metal such as Ag, Al or indium (In), or a material of a stacked structure of these metals can be used. It is also possible to use, for example, a structure that a compound of an active metal such as Li, Mg or Ca and a halogen such as fluorine or bromine, oxygen or the like is inserted as a thin layer between the upper electrode 12 and an organic layer to be formed above the upper electrode 12.

When the display system is of the transmission type or the dual-sided emission type and the lower electrode 12 is used as an anode, the lower electrode 12 is formed with a high-transmittance conductive material such as ITO (indium-tin-oxide) or IZO (indium-zinc-oxide).

It is to be noted that, when an active matrix system is adopted as the drive system for the display system to be manufactured in this embodiment, the display system may desirably be designed as the top emitting type to assure a sufficient aperture ratio for each organic electroluminescent device.

After the lower electrode 12 (the anode in this embodiment) has been formed as described above, an insulating film 13 is then formed in patterns such that the insulating film 13 covers the lower electrode 12 at a periphery thereof. Portions of the lower electrode 12, which are exposed through windows formed in the insulating film 13 as described above, are used as pixel regions at which respective organic electroluminescent devices are to be arranged. This insulating film 13 is assumed to be formed, for example, by using an organic insulating material such as a polyimide or photoresist or an inorganic insulating material such as silicon oxide.

Subsequently, a hole injection layer 14 is formed as a layer which commonly covers the lower electrode 12 and the insulating layer 13. This hole injection layer 14 is formed using a general hole injection material. For example, m-MTDATA [4,4,4-tris(3-methylphenylphenylamino)triphenylamine] represented by the following structural formula (2) is vapor-deposited into a film of 25 nm in thickness.

Structural formula (2)

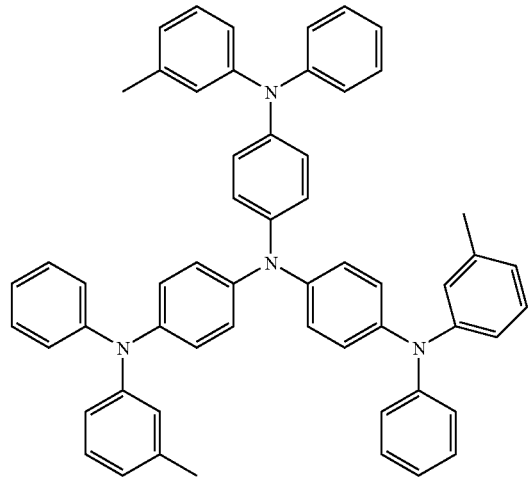

The steps up to the immediately above step may be performed similarly as in the manufacture of a display system making use of ordinary organic electroluminescent devices.

Figure 3B:
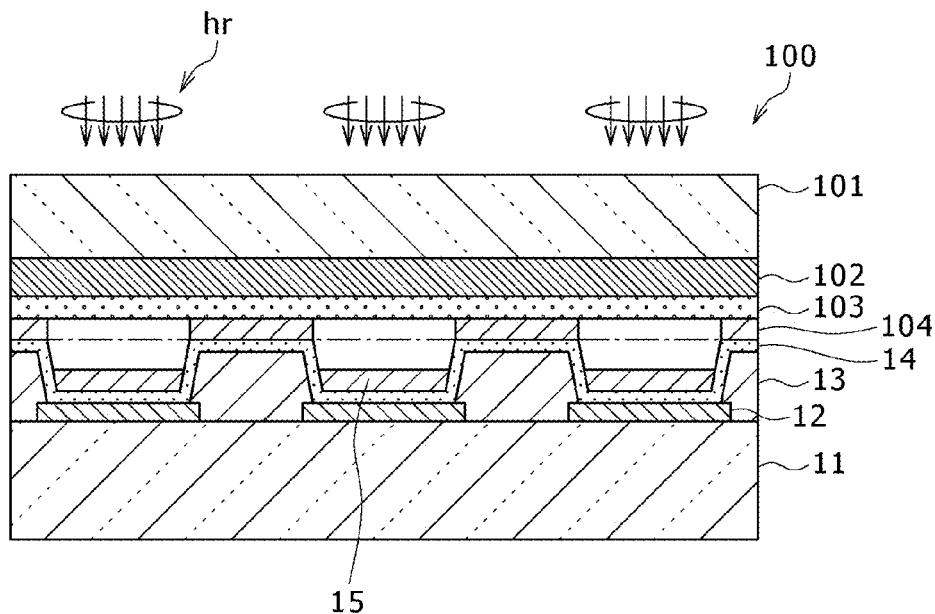

As illustrated in FIG. 3B, the transfer substrate 100 is then arranged opposite the system substrate 11 with the hole injection layer 14 formed thereon. At this time, the transfer substrate 100 and the system substrate 11 are arranged such that the transfer layer 104 and the hole injection layer 14 face each other. As an alternative, the system substrate 11 and the transfer substrate 100 may be brought into close contact with each other such that the hole injection layer 14, which constitutes an uppermost layer on the side of the system substrate 11, and the transfer layer 104, which constitutes an upper layer on the side of the transfer substrate 100, come into contact with each other. Even when arranged in this manner, the transfer layer 14 formed of the hole-transporting material is brought into such a state as being supported on the insulating film 13 on the side of the system substrate 11, and therefore, the transfer substrate 100 does not come into contact with the areas of the hole injection layer 14 on the lower electrode 12.

From the side of the base substrate 101 of the transfer substrate 100 arranged opposite the system substrate 11 as described above, a laser beam hr, for example, of 800 nm wavelength is then irradiated. At this time, the laser beam hr is selectively irradiated in spots onto areas corresponding to the respective pixel regions because a hole transport layer to be described subsequently herein is common to the organic electroluminescent devices of the respective colors.

The laser beam hr is then absorbed in the photothermal conversion layer 102, and by using the resulting heat, the transfer layer 104 is thermally transferred to the side of the system substrate 11. At this time, a hole transport layer 15 is surely formed in patterns on the lower electrode 12 through the hole injection layer 14 because the transfer substrate 100 is provided with the transfer layer 104 made of the hole-transporting material and constructed as described above.

In this step, it is important to perform the irradiation of the laser beam hr such that the upper surface of the lower electrode 12, the upper surface being exposed through the insulating film 13 at the pixel regions, is completely covered by the hole transport layer 15.

It is desired to perform the above-mentioned heat transfer step in a vacuum, although the heat transfer step is feasible under atmospheric pressure. By performing the heat transfer in a vacuum, the transfer can be effected with a laser beam hr of lower energy so that the adverse thermal effects to be given to the hole transport layer 15 during its transfer can be lessened. Further, the performance of the heat transfer step in a vacuum makes it possible to enhance the close contact between the substrates themselves and to effect the transfer with better pattern accuracy, and therefore, is desired. Moreover, the devices can be protected from deterioration by continuously performing all the steps in a vacuum.

In the above-described step that the laser beam hr is selectively irradiated in spots, it is only necessary to irradiate the laser beam hr with an appropriate spot diameter onto the transfer substrate 100 along the lower electrode 12 when a drive unit for a laser head in a laser irradiation system is equipped with a precise alignment system. In this case, it is no longer necessary to strictly perform the alignment between the system substrate 11 and the transfer substrate 100. When the drive unit for the laser head is not equipped with any precise alignment system, on the other hand, it is necessary to form beforehand, on the side of the transfer substrate, a light-shielding film that restricts regions to be irradiated with the laser beam hr. Described specifically, a light-shielding film formed by arranging openings in a highly reflective metal layer which reflects a laser beam is arranged on a back side of the transfer substrate 100. Further, a low-reflective metal may be formed as a film on the light-shielding film. In this case, a need arises to accurately perform the alignment between the system substrate 11 and the transfer substrate 100.

In this embodiment, the hole transport layer 15 was formed in patterns by the single heat transfer step. When the thickness of the hole transport layer 15 is too large to effect its transfer at once (for example, 40 nm or greater), the hole transfer layer 15 can be formed by performing the heat transfer step, which makes use of the transfer substrate 100, a plurality of times.

After the above-described step, a heating step is performed. Described specifically, the system substrate 11 is heated immediately after the transfer of the transfer layer 104. For example, the heating temperature may preferably be within the ±30° C. range of a glass transition temperature (Tg) possessed by the organic material which makes up the hole transport layer 15. When a material with no appreciable Tg is used as the transfer layer 104, on the other hand, the range of 100° C.±50° C. is preferred as a specific heating temperature, with the range of 100° C.±30° C. being more preferred because the performance of the heating step in the latter range induces no thermal degradation of the organic materials which make up the remaining organic layers. By this heating step, the hole transport layer 15 is stabilized to achieve improvements in luminescence efficiency and brightness half-life.

Figure 3C:
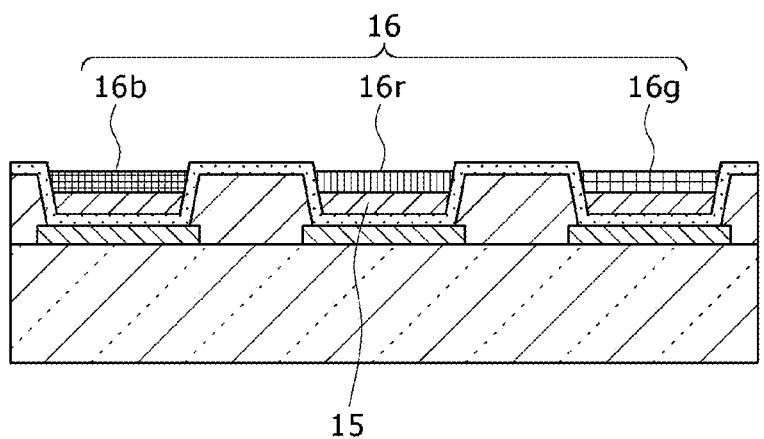

As illustrated in FIG. 3C, light-emitting layers 16 made of organic light-emitting materials of respective colors are then formed on the hole transport layer 15 by the vacuum deposition process. For the formation of a blue light emitting layer 16b, a material obtained by mixing 2.5 wt % of a styrylamine derivative, which is represented by the following structural formula (4) and is a blue light emitting guest material, with ADN, which is represented by the following structural formula (3) and is an electron-transporting host material, is vapor-deposited as a film of approx. 35 nm thickness on the hole transport layer 15 at the regions where blue light emitting devices are to be formed.

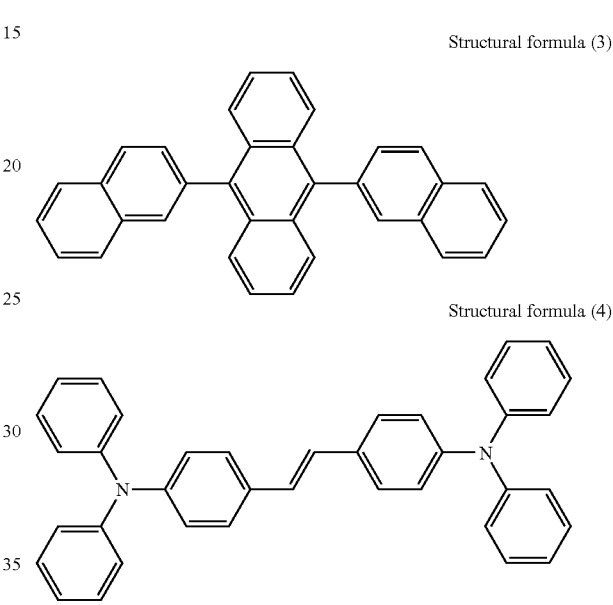

Structural formula (3)

Structural formula (4)

For the formation of a red light emitting layer 16r, a material obtained by mixing 30 wt % of 2,6-bis[(4'-methoxydiphenylamino)styryl]-1,5-dicyanonaphthalene (BSN), which is a red light emitting guest material, with the above-described AND as a host material, is vapor-deposited as a film of approx. 30 nm thickness on the hole transport layer 15 at the regions where red light emitting devices are to be formed.

For the formation of a green light emitting layer 16g, a material obtained by mixing 5 wt % of coumarin 6, which is a green light emitting guest material, with the above-described AND as a host material, is vapor-deposited as a film of approx. 30 nm thickness on the hole transport layer 15 at the regions where green light emitting devices are to be formed.

In this embodiment, the description has been made about the example in which the light emitting layers 16 of the respective colors were formed in patterns by the vacuum deposition process. As in the formation step of the hole transport layer 15, however, the light emitting layers 16 of the respective colors may be formed by the heat transfer process.

Figure 3D:
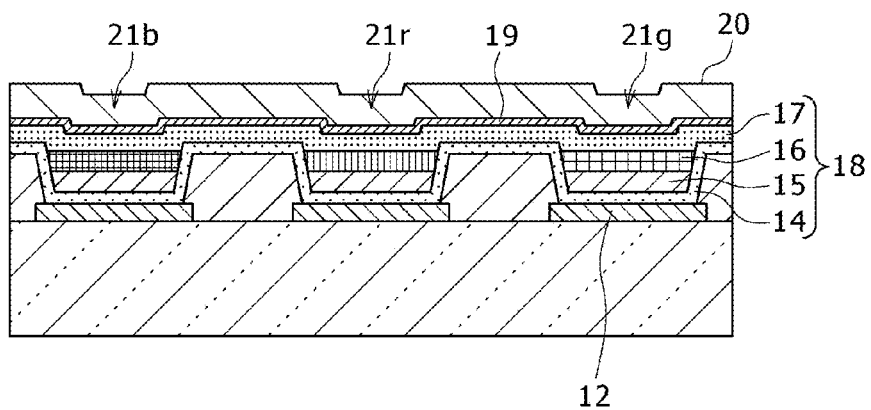

As illustrated in FIG. 3D, an electron transport layer 17 is vapor-deposited as a common layer over the entire surface of the system substrate 11 after the above-described step. This electron transport layer 17 is formed with a general electron-transporting material. For example, Alq$_3$ is vapor-deposited at a thickness of 20 nm or so.

By the hole injection layer 14, hole transport layer 15, light emitting layers 16r, 16g, 16g of the respective colors, and electron transport layer 17 formed as described above, an organic layer 18 is constructed.

An electron injection layer 19 is then formed on the electron transport layer 17 by the vacuum deposition process. This electron injection layer 19 is vapor-deposited as a common layer over the whole surface of the system substrate 11. This electron injection layer 19 is formed with an ordinary electron injection material. For example, lithium fluoride (LiF) can be formed at a film thickness of about 0.3 nm (deposition rate: approx. 0.01 nm/sec) by the vacuum deposition process.

An upper electrode 20 is then formed on the electron injection layer 19. This upper electrode 20 is used as a cathode when the lower electrode 12 is an anode, but is used as an anode when the lower electrode 12 is a cathode. When the display system to be manufactured in this embodiment uses the simple matrix system, the upper electrode 20 is formed, for example, in the form of strips which intersect with stripes of the lower electrode 12. When the display system uses the active matrix system, on the other hand, the upper electrode 20 is assumed to be formed in the form of a solid film formed such that it covers the whole surface of the system substrate 11, and to be used as an electrode common to the respective pixels. In this case, an auxiliary electrode (not shown) may be formed with the same material as the lower electrode 12, and the upper electrode 20 may be connected to this auxiliary electrode to form a construction that prevents a voltage drop at the upper electrode 20.

Red light emitting devices 21r, green light emitting devices 21g and blue light emitting devices 21b are, therefore, formed in portions, where the organic layers 18 including the light emitting layers 16r, 16g, 16b of the respective colors are held, at the intersections between the lower electrode 12 and the upper electrode 20.

For the upper electrode 20, a suitable material is supposed to be chosen and used depending on the light output system of the display system to be manufactured in this embodiment. Described specifically, when the display system is of the top emitting type that emitted light is outputted from the side opposite to the system substrate 11 or is of the dual-sided emission type, the upper electrode 20 is formed with a light transmitting material or semi-transmissive material. When the display system is of the transmission type that emitted light is outputted from the side of the system substrate 11, the upper electrode 20 is formed with a highly reflective material.

In this embodiment, the display system is of the top emitting type and the lower electrode 12 is used as an anode, so that the upper electrode 20 is used as a cathode. In this case, the upper electrode 20 is formed using a material having good light transparency among the materials having a small work function and exemplified in connection with the formation step of the lower electrode 12 such that electrons can be efficiently injected into the organic layer 18.

Therefore, the upper electrode 20 is formed, for example, as a common cathode formed with MgAg at a thickness of 10 nm by the vacuum deposition process. At this time, the formation of the upper electrode 20 is performed by a film-forming process making use of film-forming particles of energy low enough to avoid any effect on the underlying layers, for example, by the vapor-deposition process or the CVD (chemical vapor deposition) process.

When the display system is of the top emitting type, it is preferred to design such that the intensity of light to be outputted can be increased by forming the upper electrode 20 as a semi-transmissive electrode to construct a resonator structure between the upper electrode 20 and the lower electrode 12.

When the display system is of the transmission type and the upper electrode 20 is used as a cathode, the upper electrode 20 is formed with a conductive material having a small work function and a high reflectivity. When the display system is of the transmission type and the upper electrode 19 is used as an anode, the upper electrode 20 is formed with a conductive material having a high reflectivity.

Figure 3E:
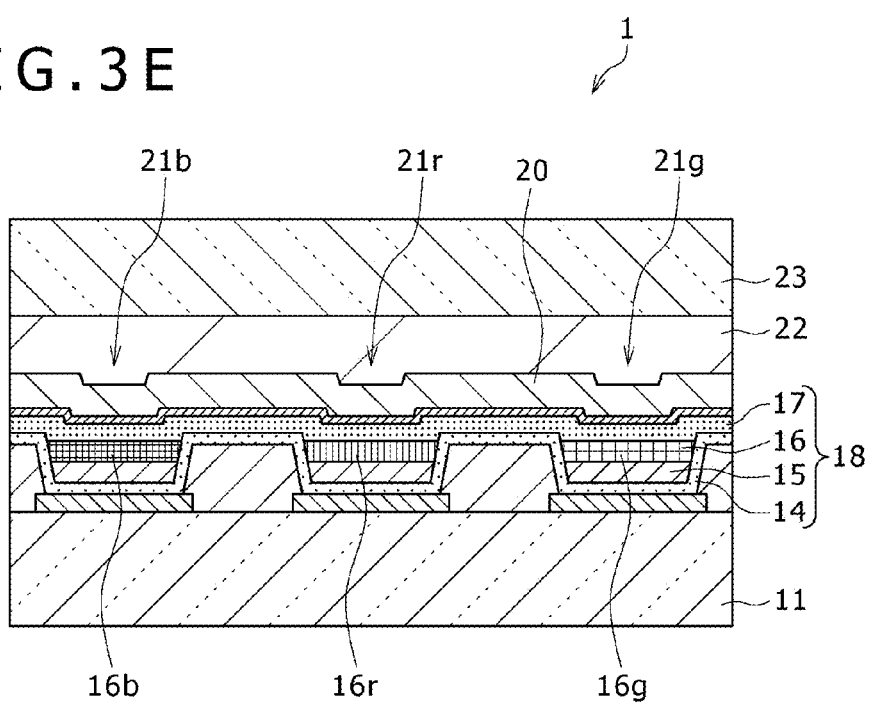

After the organic electroluminescent devices 21r, 21g, 21b of the respective colors are formed as described above, a protective film 22 is formed to cover the upper electrode 20 as illustrated in FIG. 3E. This protective layer 22 is intended to prevent water from reaching the organic layer 18, and is supposed to be formed at a sufficient thickness with a material having low water permeability and water-absorbing property. When the display system to be manufactured in this embodiment is of the top emitting type, this protective film 22 is supposed to be made of a material which transmits light generated in the light emitting layers 16r, 16g, 16b of the respective colors, so that a transmittance of 80% or so can be assured, for example.

The above-described protective film 22 may be formed with an insulating material. When the protective film 22 is formed with an insulating material, an inorganic amorphous insulating material, for example, amorphous silicon ($\alpha$-Si), amorphous silicon carbide ($\alpha$-SiC), amorphous silicon nitride ($\alpha$-Si$_{1-x}$N$_x$), amorphous carbon ($\alpha$-C) or the like can be suitably used. Such an inorganic amorphous insulating material does not form grains and therefore, is low in water permeability, so that the protective film 22 is provided with good waterproofing property.

When amorphous silicon nitride is used to form the protective film 22, for example, the amorphous silicon nitride is formed into a film of from 2 to 3 µm in thickness by the CVD process. At this time, it is, however, desired to set the film-forming temperature at room temperature for the prevention of a reduction in brightness due to a deterioration of the organic layer 18 and also to perform the formation of the film under conditions that minimize the stress on the film for the prevention of peeling of the protective layer 22.

When the display system to be manufactured in this embodiment uses the active matrix system and the upper electrode 20 is arranged as a common electrode covering the whole surface of the system substrate 11, the protective film 22 may be formed with a conductive material. When the protective film 22 is formed with such a conductive material, a transparent conductive material such as ITO or IXO can be used.

These layers 17, 19 to 22, which cover the light emitting layers 16r, 16b, 16g of the respective colors, are each formed as a solid film without using any mask. It is preferred to perform the formation of these layers 17, 19 to 22 continuously in the same film-forming apparatus desirably without exposure to the atmosphere. This makes it possible to avoid the deterioration of the organic layer 18 which would otherwise occur by water in the atmosphere. Further, the layers which make up the organic layer 18 and are other than the hole transport layer 15 and light emitting layers 16, that is, the hole injection layer 14 and electron transport layer 17 may be formed at the pixel regions by the heat transfer process.

To the system substrate 11 with the protective film 22 formed thereon as described above, a protective substrate 23 is bonded on the side of the protective film 22 via an adhesive resin material (not shown). As the adhesive resin material, an ultraviolet-curing resin can be used, for example. As the protective substrate 23, on the other hand, a glass substrate can be used, for example. It is, however, to be noted that, when the display system to be manufactured is of the top emitting type, it is essential that the adhesive resin material and protective substrate 23 are made of materials having light transparency, respectively.

By the above-described steps, a full-color display system 1 with the light-emitting devices 21r, 21g, 21b of the respective colors formed in arrays on the system substrate 11 is completed.

According to the above-described transfer substrate 100 and the above-described fabrication process of organic electroluminescent devices, the fabrication process making use of the transfer substrate 100, the hole transport layer 15 can be surely formed in a pattern on the lower electrode 12 via the hole injection layer 14 by the heat transfer process owing to the use of the organic material, the weight decrease initiation temperature ($T_{sub}$) of which is lower than 500° C. and the weight decrease initiation temperature ($T_{sub}$) and melting point ($T_m$) of which satisfy the equation (1). It is, therefore, possible to avoid deteriorations of the characteristics of organic electroluminescent devices, which would otherwise occur by incomplete transfer of the hole transport layer 15.

In the above embodiment, the description was made primarily about the case that the lower electrode 12 was formed as an anode and the upper electrode 20 was formed as a cathode. The present invention can also be applied to the case that the lower electrode 12 was formed as a cathode and the upper electrode 20 was formed as an anode. In such a case, the individual layers 14 to 17, 19 between the lower electrode 12 and the upper electrode 20 are stacked in the reverse order.

The present invention described above based on the embodiment is effective not only for devices with common layers separated as mentioned above but also for tandem organic EL devices in each of which units of organic layers having light emitting layers, respectively, (light emitting units) are stacked as illustrated, for example, in Japanese Patent Laid-Open No. 2003-272860, and can bring about similar advantageous effects.

Second Embodiment

<Transfer Substrate>

Figure 4:
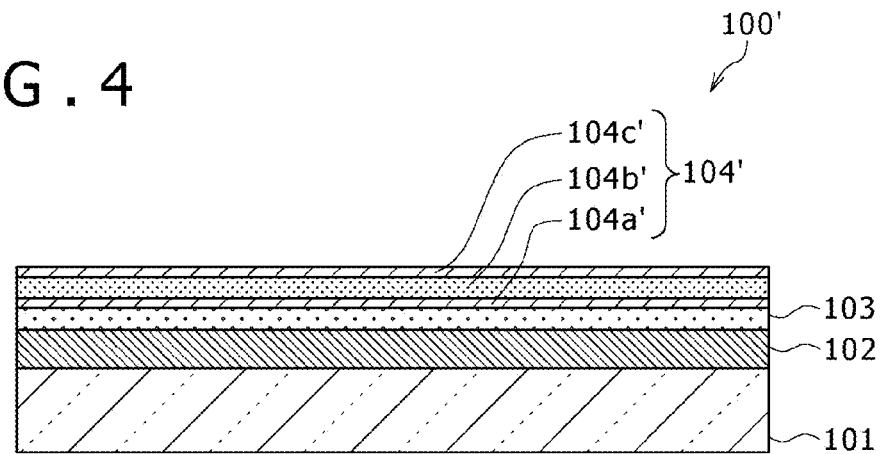
FIG. 4 is a cross-sectional view for describing a second embodiment of the transfer substrate of the present invention.

FIG. 4 is a cross-sectional construction diagram of a transfer substrate 100' for use in this embodiment. It is to be noted that like elements of structure to those in the first embodiment will be described by applying like reference numerals. As depicted in this figure, the transfer substrate 100' is constructed by successively stacking a photothermal conversion layer 102, an antioxidant layer 103 and a transfer layer 104' on a base substrate 101.

In this embodiment, the transfer layer 104' is formed by stacking at least three organic material layers one over another. Described specifically, the transfer 104' layer is constructed by successively stacking a first layer 104a', a second layer 104b' and a third layer 104c' from the side of the base substrate 101.

The first layer 104a' on the side of the base substrate 101 and the third layer 104c' on the side of the surface are each formed with an organic material selected from the group including a first organic material, which has a weight decrease initiation temperature ($T_{sub}$) of lower than 500° C. and sublimates under atmospheric pressure, and a second organic material, which has a weight decrease initiation temperature ($T_{sub}$) of lower than 500° C. and satisfies the following equation (1):

$$T_{sub} - T_m < 200° C. \quad (1)$$

where
$T_{sub}$: the weight decrease initiation temperature of the second organic material, and
$T_m$: a melting point of the second organic material.

Therefore, the holding of second layer 104b' between the first layer 104a' and the third layer 104c', which are formed with the organic materials satisfying the equation (1), makes it possible to surely transfer the second layer 104b' to the side of the transferred substrate even if the second layer 104b' is formed of a material which does not satisfy the equation (1) and is hardly transferable. The second layer 104b' can hence be surely transferred to the side of the transferred substrate even if the second layer 104b' is formed with a hole-transporting material hardly transferable as a single layer and is formed at a thickness of from 50 nm to 100 nm. The first layer 104a' and third layer 104c' are each assumed to be formed at a thickness of from 5% to 10% based on the total thickness of the transfer layer 104'.

When the second layer 104b' is formed with a hole-transporting organic material, it is preferred that the first layer 104a' and third layer 104c' are also formed with hole-transporting organic materials, respectively. The first layer 104a' and third layer 104c' may, however, be formed with organic materials having different properties from the organic material of the second layer 104b, for example, electron-transporting organic materials provided that deteriorations in the characteristics of the resulting organic electroluminescent devices are within permissible ranges. It is preferred, but not particularly limited to, that the first layer 104a' and third layer 104c' are formed with the same material, because the formation of the transfer substrate 100' is facilitated.

In the transfer substrate 100' to be employed in this embodiment, the first layer 104a' and third layer 104c' are assumed to be formed with "LG101C" (trade name for a hole-transporting material, product of Idemitsu Kosan Co., Ltd.) and the second layer 104b' as a layer held between the first layer 104a' and third layer 104c' is formed with "HT-320" (trade name for a hole-transporting organic material, product of Idemitsu Kosan Co., Ltd.).

It is to be noted that the above description was made about an example in which the second layer 104b' is a single layer but the second layer 104b' may be formed of plural layers.

<Fabrication Process of Organic Electroluminescent Devices>

Figure 5:
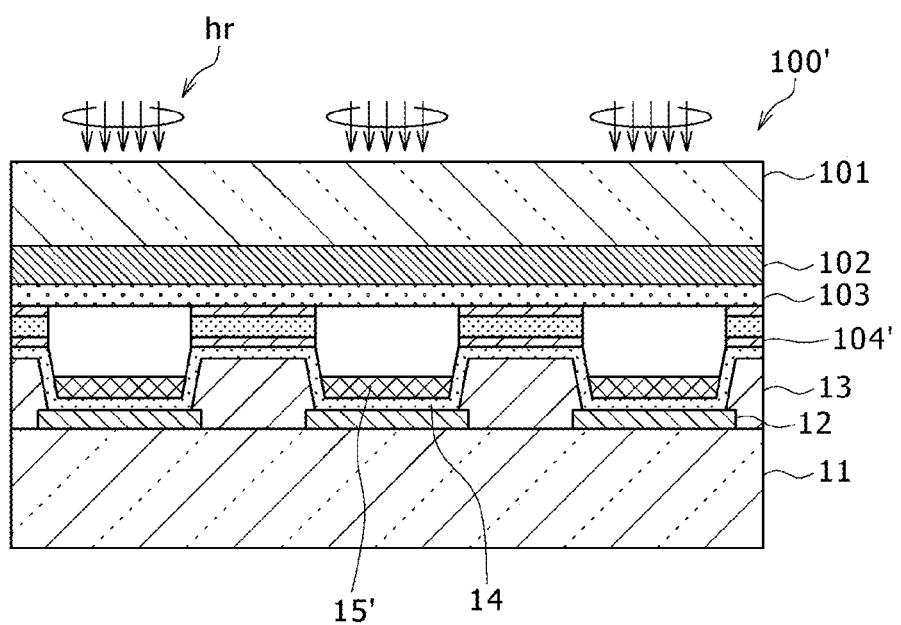
FIG. 5 is a cross-sectional view fro describing a second embodiment of the process of the present invention for the fabrication of organic electroluminescent devices.
Figure 6A:
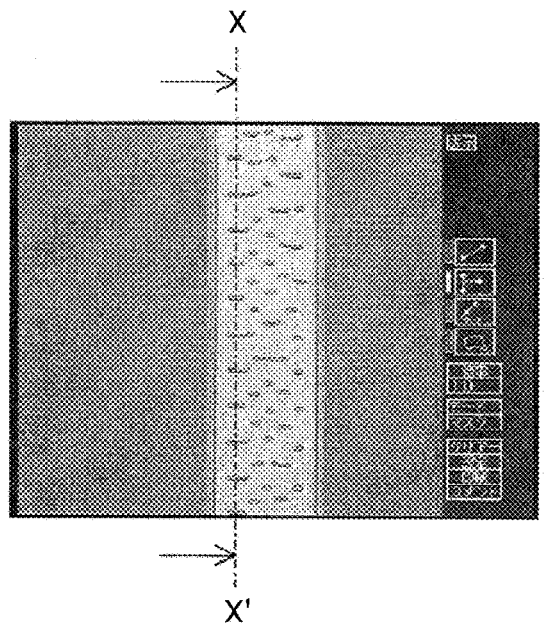
FIG. 6A is a micrograph for describing problems of an existing transfer substrate.
Figure 6B:
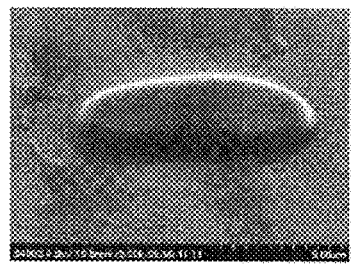
FIG. 6B is a closeup photo of one of liquid droplets.
Figure 6C:
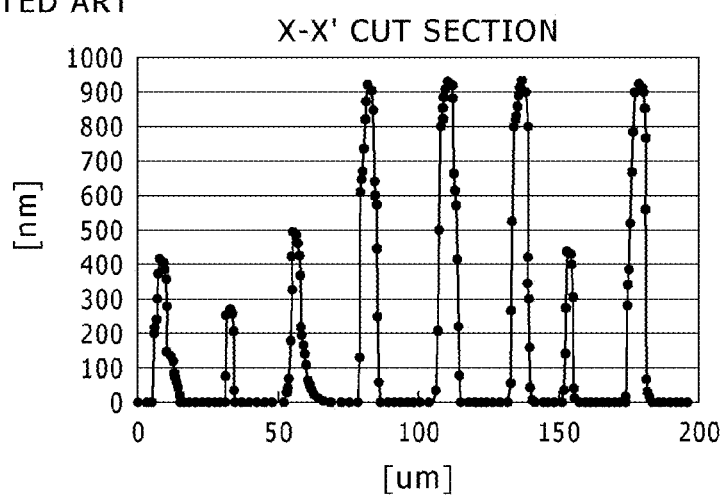
FIG. 6C is a graph illustrating surface heights of the transfer substrate after thermal transfer.

The fabrication of organic electroluminescent devices, which makes use of the above-described transfer substrate 100', is performed in a similar manner as in the first embodiment. Described specifically, in the step described with reference to FIG. 3B in the first embodiment, the transfer substrate 100' is arranged opposite a system substrate 11 with a hole injection layer 14 formed thereon, as shown in FIG. 5. At this time, the transfer substrate 100' and the system substrate 11 are arranged such that the transfer layer 104' and the hole injection layer 14 face each other.

From the side of the base substrate 101 of the transfer substrate 100' arranged opposite the system substrate 11 as described above, a laser beam hr, for example, of 800 nm wavelength is then irradiated. At this time, the laser beam hr is selectively irradiated in spots onto areas corresponding to the respective pixel regions because a hole transport layer to be described subsequently herein is common to the organic electroluminescent devices of the respective colors.

The laser beam hr is then absorbed in the photothermal conversion layer 102, and by using the resulting heat, the transfer layer 104' is thermally transferred to the side of the system substrate 11. As a result, a hole transport layer 15' is surely formed in patterns on the lower electrode 12 through the hole injection layer 14. In this case, the hole transport layer 15' is formed of a mixture of the materials of the respective layers of the transfer layer 104' formed of the above-described three layers. Subsequently, the system substrate 11 with the hole transport layer 15' formed thereon is heated at a temperature around the Tg of the organic material which primarily makes up the hole transport layer 15'.

In a similar manner as in the steps described with reference to FIGS. 3C to 3E in the first embodiment, subsequent steps are conducted to fabricate organic electroluminescent devices.

According to the above-described transfer substrate 100' and the above-described fabrication process of organic electroluminescent devices, the fabrication process making use of the transfer substrate 100', the hole transport layer 15' can be surely formed in a pattern on the lower electrode 12 via the hole injection layer 14 by the heat transfer process owing to the formation of the first layer 104a', on the side of the base substrate, and the third layer 104c', on the side of the surface, as the transfer layer 104' with the organic material, which has a weight decrease initiation temperature ($T_{sub}$) of lower than 500° C. and sublimates under atmospheric temperature. It is, therefore, possible to avoid deteriorations of the characteristics of the organic electroluminescent devices, which would otherwise occur by incomplete transfer of the hole transport layer 15'.

EXAMPLES

A description will next be made of fabrication procedures of organic electroluminescent devices of specific examples of the present invention and comparative examples to these specific examples and also of their evaluation results.

Examples 1 to 5

In a similar manner as the procedure described above with reference to FIG. 1 in the first embodiment, transfer substrates 100 were fabricated by varying the material of the transfer substrate 104. As will be shown below in Table 1, a transfer layer 104 was formed, as Example 1, with "LG101C" (trade name, product of LG Chem, Ltd.) which has a weight decrease initiation temperature ($T_{sub}$) of lower than 500° C. and sublimates under atmospheric temperature. As Examples 2 to 5, transfer layers 104 were formed with organic materials, the weight decrease initiation temperature ($T_{sub}$) of each of which is lower than 500° C. and the weight decrease initiation temperature ($T_{sub}$) and melting point ($T_m$) of each of which satisfy the above-described equation (1). Specifically, the transfer layers 104 were formed with $Alq_3$ in Example 2, ADN in Example 3, α-NPD in Example 4, and CBP in Example 5.

Comparative Examples 1 and 2

As Comparative Examples 1 and 2 to the above-described Examples 1 to 5, there were also prepared transfer substrates having transfer layers 104 formed with organic materials which as shown above in Table 1, are not sublimable materials and do not satisfy the equation (1). Specifically, the transfer layers 104 were formed with "HT-320" (trade name, product of Idemitsu Kosan Co., Ltd.) in Comparative Example 1 and "HT-539" (trade name, product of Idemitsu Kosan Co., Ltd.) in Comparative Example 2.

[Evaluation Results]

Using the above-mentioned transfer substrates of Examples 1 to 5 and those of Comparative Examples 1 and 2, patterns were formed on transferred substrates by the heat transfer process. The results are shown above in Table 1. In Table 1, "SUCCEEDED" indicates that the pattern formation was surely effected, while "FAILED" indicates that the transfer was not effected and the transfer layer remained as liquid droplets on the transfer substrate. As shown in Table 1, the sure pattern formation onto the transferred substrate was confirmed (SUCCEEDED) when the transfer substrate 100 of each of Examples 1 to 5 was used. On the other hand, no transfer was confirmed to take place (FAILED) in Comparative Examples 1 and 2 in which the values of $T_{sub} - T_m$ were greater than 200° C.

Examples 6 to 10

<Transfer Substrates>

Example 6

A transfer substrate 100' was prepared as will be described next. Firstly, a photothermal conversion layer 102 made of Mo and having a thickness of 200 nm was formed on a base substrate made of a glass substrate by the general sputtering process. On the photothermal conversion layer 102, an antioxidation layer 103 made of $SiN_x$ was then formed at a thickness of 100 nm by the CVD process.

Subsequently, a first layer 104a', second layer 104b' and third layer 104c' were successively formed with the organic materials and thicknesses shown in Table 2, respectively, so that a transfer layer 104' was formed.

TABLE 1

|  | Transfer layer | $T_{sub}$ (° C.) | $T_m$ (° C.) | $T_{sub} - T_m$ (° C.) | Transfer |
| --- | --- | --- | --- | --- | --- |
| Example 1 | "LG101C" | 495 | nd* | — | Succeeded |
| Example 2 | $Alq_3$ | 431 | 415 | 16 | Succeeded |
| Example 3 | ADN | 395 | 384 | 11 | Succeeded |
| Example 4 | α-NPD | 432 | 281 | 151 | Succeeded |
| Example 5 | CBP | 440 | 282 | 158 | Succeeded |
| Comp. Ex. 1 | "HT-320" | 507 | 265 | 242 | Failed |
| Comp. Ex. 2 | "HT-539" | 520 | 270 | 250 | Failed |

*Not detected

TABLE 2

|  | Transfer layer | | | Organic EL device | |
| --- | --- | --- | --- | --- | --- |
|  | 1st layer (thickness, nm) | 2nd layer (thickness, nm) | 3rd layer (thickness, nm) | Voltage (V) | Current efficiency (cd/A) |
| Example 6 | "LG101C" (5) | "HT-320" (100) | "LG101C" (5) | 7.5 | 4.5 |
| Example 7 | α-NPD (10) | "HT-320" (100) | α-NPD (10) | 7.9 | 4.3 |
| Example 8 | "LG101C" (5) | "HT-320" (100) | Alq$_3$ (10) | 8.0 | 4.1 |
| Example 9 | α-NPD (10) | "HT-320" (100) | Alq$_3$ (10) | 8.0 | 4.0 |
| Example 10 | Alq$_3$ (10) | "HT-320" (100) | Alq$_3$ (10) | 9.5 | 4.0 |
| Comp. Ex. 3 | — | "HT-320" (100) | — | Failed to transfer | |
| Comp. Ex. 4 | — | "HT-320" (100) | Alq$_3$ (10) | Failed to transfer | |
| Comp. Ex. 5 | α-NPD (10) | "HT-320" (100) | — | 12.1 | 1.2 |

In this embodiment, "LG101C" (trade name, product of LG Chem, Ltd.) which has a weight decrease initiation temperature ($T_{sub}$) of lower than 500° C. and sublimates under atmospheric pressure was used for the first layer 104a' and third layer 104c', and "HT-320" (trade name, product of Idemitsu Kosan Co., Ltd.) which is a hole-transporting material hardly transferable as a single layer was employed for the second layer 104b'.

Example 7

In this embodiment, a transfer substrate 100' was prepared in a similar manner as in Example 6 except that α-NPD, a hole-transporting material the weight decrease initiation temperature ($T_{sub}$) of which is lower than 500° C. and the weight decrease initiation temperature ($T_{sub}$) and melting point ($T_m$) of which satisfy the above-described equation (1), was used for the first layer 104a' and third layer 104c'.

Example 8

In this embodiment, a transfer substrate 100' was prepared in a similar manner as in Example 6 except that the above-described "LG101C," a hole-transporting material, was used for the first layer 104a' and Alq$_3$, an electron-transporting material the weight decrease initiation temperature ($T_{sub}$) of which is lower than 500° C. and the weight decrease initiation temperature ($T_{sub}$) and melting point ($T_m$) of which satisfy the above-described equation (1), was employed for the third layer 104c'.

Example 9

In this embodiment, a transfer substrate 100' was prepared in a similar manner as in Example 6 except that the above-described α-NPD was used for the first layer 104a' and the above-described Alq$_3$ was employed for the third layer 104c'.

Example 10

In this embodiment, a transfer substrate 100' was prepared in a similar manner as in Example 6 except that Alq$_3$, an electron-transporting material the weight decrease initiation temperature ($T_{sub}$) of which is lower than 500° C. and the weight decrease initiation temperature ($T_{sub}$) and melting point ($T_m$) of which satisfy the above-described equation (1), was used for the first layer 104a' and third layer 104c'.

Comparative Examples 3 to 5

As Comparative Example 3 to Examples 6 to 10, a transfer substrate was prepared in a similar manner as in Example 7 except that the transfer layer 104' was formed with only "HT-320" (trade name, product of Idemitsu Kosan Co., Ltd.). As Comparative Example 4, a transfer substrate was prepared in a similar manner as in Example 7 except that a third layer made of the above-described Alq$_3$ alone was formed only on the side of a surface of "HT-320" (as a second layer). Further, as Comparative Example 5, a transfer substrate was prepared in a similar manner as in Example 7 except that a first layer made of α-NPD was formed only on the side of a base substrate of "HT-320" (as a second layer).

<Fabrication Process of Organic Electroluminescent Devices>

Using the above-mentioned transfer substrates 100' of Examples 6 to 10 and the above-mentioned transfer substrates of Comparative Examples 3 to 5, organic electroluminescent devices, that is, blue-light emitting devices were formed in a similar manner as in the second embodiment, respectively.

Prepared firstly were cells for top-emitting organic electroluminescent devices, which on a system substrate 11 made of a glass plate of 30 mm×30 mm, carried as a lower electrode (anode) 12 an ITO transparent electrode of 12.5 nm in thickness stacked on a Ag alloy (reflective layer) of 190 nm in thickness. An insulating film 13 of silicon oxide was then formed at a thickness of about 2 μm by the sputtering process to cover the lower electrode 12 at a periphery thereof, and by a lithographic process, the lower electrode 12 was exposed as pixel regions.

As a hole injection layer 14 in the form of an organic layer, a film made of m-MTDATA was then formed at a thickness of 12 nm (deposition rate: 0.2 to 0.4 nm/sec) by the vacuum deposition process.

The transfer substrate 100' of Example 6, on which a transfer layer 104' of the above-mentioned construction had been formed, was arranged opposite the system substrate 11 with the hole injection layer 14 formed thereon, and in a vacuum, those transfer substrate and system substrate were brought into close contact with each other. A small clearance of about 2 μm was retained between those substrates because of the thickness of the insulating film 13. In this state, a laser beam hr of 800 nm wavelength was irradiated corresponding to the pixel regions of the device-fabricating system substrate 11 from the side of the base substrate 101 in the transfer substrate 100'. As a result, the transfer layer 104' was thermally transferred from the transfer substrate 100' to form a hole transport layer 15. The spot size of the laser beam hr was controlled at 300 μm×10 μm. The laser beam hr was caused to scan in a direction perpendicular to the lengthwise dimension of the beam. The energy density was controlled at $2.6 \text{ E}^{-3} \text{ mJ/μm}^2$.

Subsequently, the system substrate 11 with the hole transport layer 15 formed thereon was subjected to a heating step at 100° C. for 30 minutes under an atmosphere of nitrogen as an inert gas.

A blue-light emitting layer 16b made of ADN as a host material and a styrylamine derivative mixed as a blue-light emitting guest material at a relative thickness ratio of 2.5% was then formed at 35 nm by vacuum evaporation.

Subsequent to the formation of the blue-light emitting layer 16b, an electron transport layer 17 was formed. As the electron transport layer 17, Alq$_3$ was vapor-deposited at a thickness of 20 nm or so. As an electron injection layer 18, LiF was then vapor-deposited at a thickness of about 0.3 nm (deposition rate: approx. 0.01 nm/sec). As a cathode to be employed as the upper electrode 20, MgAg was then vapor-deposited at a thickness of 10 nm to obtain blue-light emitting devices. Organic electroluminescent devices of Examples 7 to 10 and Comparative Examples 3 to 5 were fabricated in a similar manner as in Example 6.

[Evaluation Results]

Table 2 shows voltages and current efficiencies at 10 mA/cm$^2$ of the blue-light emitting devices fabricated with the transfer substrates of Examples 6 to 10 and Comparative Examples 3 to 5 by the above-mentioned fabrication process. As shown in Table 2, it was confirmed that the transfer was surely effected in the organic electroluminescent devices fabricated with the transfer substrates 100' of Examples 6 to 10 of the construction that the second layer 104b' made of "HT-320" was held between the first layer 104a' and third layer 104c' each of which was made of the organic material which has a weight decrease initiation temperature ($T_{sub}$) of lower than 500° C. and sublimates under atmospheric pressure or an organic material the weight decrease initiation temperature ($T_{sub}$) of which is lower than 500° C. and the weight decrease initiation temperature ($T_{sub}$) and melting point ($T_m$) of which satisfy the above-described equation (1).

In Comparative Examples 3 and 4, on the other hand, the hole transport layer 15 was not formed in a pattern. In Comparative Example 6 in which only the first layer 104a' was formed with α-NPD, the hole transport layer 15 was formed in a pattern but the pattern configuration was incomplete. It was, therefore, confirmed that the drive voltage was high and the current efficiency was low.

Among the transfer substrates of Examples 6 to 10, the transfer substrates of Examples 6 and 7, in each which the first layer 104a' and the third layer 104c' were both made of the same hole-transporting material, were lower in drive voltage and higher in current efficiency than the transfer substrates of Examples 8 to 10 in each of which at least one of the first layer 104a' and third layer 104c' is made of the electron-transporting material.

It should be understood by those skilled in the art that various modifications, combinations, sub-combinations and alterations may occur depending on design requirements and other factor in so far as they are within the scope of the appended claims or the equivalents thereof.

What is claimed is:

1. A transfer substrate with a photothermal conversion layer and a transfer layer formed in this order on a base substrate, wherein:

said base substrate is transparent to laser light of; and said transfer layer is formed of an organic material selected from the group including a first organic material, which has a weight decrease initiation temperature $T_{sub}$ of lower than 500° C. and sublimates under atmospheric pressure, and a second organic material, which has a weight decrease initiation temperature $T_{sub}$ of lower than 500° C. and satisfies the following equation (1):

$$T_{sub}-T_m<200° \text{ C.} \quad (1)$$

where $T_{sub}$: the weight decrease initiation temperature of said second organic material, and $T_m$: a melting point of said second organic material.

2. The transfer substrate according to claim 1, wherein said first and second organic materials are hole-transporting materials.

3. A process for fabricating organic electroluminescent devices by forming a lower electrode in a pattern on a device substrate, forming on said lower electrode an organic layer including at least a light emitting layer, and then forming an upper electrode on said organic layer, said process comprising the steps of:

arranging a transfer substrate, which has a photothermal conversion layer and a transfer layer formed of an organic material in this order on a base substrate, opposite said device substrate having said lower electrode formed thereon such that said transfer layer is facing said device substrate; and irradiating light through said base substrate to said photothermal conversion layer to convert said light into heat in said photothermal conversion layer such that said transfer layer is thermally transferred onto said lower electrode to form at least said light emitting layer of said organic layer, wherein, said transfer layer is formed of an organic material selected from the group including a first organic material, which has a weight decrease initiation temperature $T_{sub}$ of lower than 500° C. and sublimates under atmospheric pressure, and a second organic material, which has a weight decrease initiation temperature $T_{sub}$ of lower than 500° C. and satisfies the following equation (1):

$$T_{sub}-T_m<200° \text{ C.} \quad (1)$$

where $T_{sub}$: the weight decrease initiation temperature of said second organic material, and $T_m$: a melting point of said second organic material.

4. A transfer substrate with a photothermal conversion layer and a transfer layer formed in this order on a base substrate, wherein:

said base substrate is transparent to laser light; and said transfer layer is formed of at least three organic material layers stacked one over another, and two of said at least three organic material layers located at the outer sides of said transfer layer are each formed of an organic material selected from the group including a first organic material, which has a weight decrease initiation temperature $T_{sub}$ of lower than 500° C. and sublimates under atmospheric pressure, and a second organic material, which has a weight decrease initiation temperature $T_{sub}$ of lower than 500° C. and satisfies the following equation (1):

$$T_{sub} - T_m < 200° \text{ C.} \qquad (1)$$

where $T_{sub}$: the weight decrease initiation temperature of said second organic material, and $T_m$: a melting point of said second organic material.

5. The transfer substrate according to claim 4, wherein said two organic material layers located at the outer sides of said transfer layer are formed of the same organic material.

6. The transfer substrate according to claim 4, wherein said at least one organic material layer held between said two organic material layers, one being on the side of said base substrate and the other on the side of said surface of said transfer layer, is formed of a hole-transporting material.

7. The transfer substrate according to claim 6, wherein said two organic material layers, one being on the side of said base substrate and the other on the side of said surface of said transfer layer, are formed of a hole-transporting material.

8. A process for fabricating organic electroluminescent devices by forming a lower electrode in a pattern on a device substrate, forming on said lower electrode an organic layer including at least a light emitting layer, and then forming an upper electrode on said organic layer, said process comprising the steps of:

arranging a transfer substrate, which has a photothermal conversion layer and a transfer layer formed of an organic material in this order on a base substrate, opposite said device substrate having said lower electrode formed thereon such that said transfer layer is facing said device substrate; and irradiating light through said base substrate to said photothermal conversion layer to convert said light into heat in said photothermal conversion layer such that said transfer layer is thermally transferred onto said lower electrode to form at least said light emitting layer of said organic layer, wherein, said transfer layer is formed of at least three organic material layers stacked one over another, and two of said at least three organic material layers located at the outer sides of said transfer layer are each formed of an organic material selected from the group including a first organic material, which has a weight decrease initiation temperature $T_{sub}$ of lower than 500° C. and sublimates under atmospheric pressure, and a second organic material, which has a weight decrease initiation temperature $T_{sub}$ of lower than 500° C. and satisfies the following equation (1):

$$T_{sub} - T_m < 200° \text{ C.} \qquad (1)$$

where $T_{sub}$: the weight decrease initiation temperature of said second organic material, and $T_m$: a melting point of said second organic material.

* * * * *